(12) United States Patent
Shimizu et al.

(10) Patent No.: US 9,048,281 B2
(45) Date of Patent: Jun. 2, 2015

(54) SEMICONDUCTOR DEVICE AND METHOD FOR PRODUCING THE SAME

(71) Applicant: NGK Insulators, Ltd., Nagoya (JP)

(72) Inventors: Naohiro Shimizu, Miura (JP); Shoji Yokoi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 101 days.

(21) Appl. No.: 13/765,129

(22) Filed: Feb. 12, 2013

(65) Prior Publication Data
US 2013/0214327 A1 Aug. 22, 2013

(30) Foreign Application Priority Data

Feb. 16, 2012 (JP) .................................. 2012-031722

(51) Int. Cl.
| | |
|---|---|
| *H01L 29/74* | (2006.01) |
| *H01L 31/111* | (2006.01) |
| *H01L 29/739* | (2006.01) |
| *H01L 29/36* | (2006.01) |
| *H01L 29/66* | (2006.01) |
| *H01L 21/225* | (2006.01) |

(52) U.S. Cl.
CPC ............ *H01L 29/7395* (2013.01); *H01L 29/36* (2013.01); *H01L 29/66356* (2013.01); *H01L 29/7392* (2013.01); *H01L 29/66333* (2013.01); *H01L 21/2254* (2013.01)

(58) Field of Classification Search
CPC ....................... H01L 29/7395; H01L 29/66333

USPC .......................................... 257/139; 438/138
See application file for complete search history.

(56) References Cited

U.S. PATENT DOCUMENTS 5,324,966 A * 6/1994 Muraoka et al. ............... 257/136
5,418,376 A 5/1995 Muraoka et al.

FOREIGN PATENT DOCUMENTS

| EP | 0 565 350 A2 | 10/1993 |
|---|---|---|
| EP | 1 094 524 A2 | 4/2001 |
| JP | 2005-285955 | 10/2005 |

OTHER PUBLICATIONS

L. Pauling, "The Nature of the Chemical Bond," Cornell University Press, 1960, p. 205 (10 pages).
Nishizawa, Junichi, et al. "Perfect Crystal Growth of Silicon by Vapor Deposition," *J. Electrochemical Society*, vol. 122, No. 5, pp. 664-669, dated 1975 (6 pages).
Partial European Search Report (Application No. 13155399.2) dated Jun. 10, 2014.

* cited by examiner

*Primary Examiner* — Theresa T Doan
(74) *Attorney, Agent, or Firm* — Burr & Brown, PLLC

(57) ABSTRACT

A semiconductor device satisfies the condition $Db \leq (1/3) \times Da$, in which Da represents a distance between a top surface of a cathode segment and an end of an embedded gate segment facing an anode segment, and Db represents a distance between a highest-impurity concentration portion in the embedded gate segment and an end of the cathode segment facing the anode segment.

14 Claims, 7 Drawing Sheets

SEMICONDUCTOR DEVICE AND METHOD FOR PRODUCING THE SAME

CROSS-REFERENCE TO RELATED APPLICATION

This application is based upon and claims the benefit of priority from Japanese Patent Application No. 2012-031722 filed on Feb. 16, 2012, the contents of which are incorporated herein by reference.

BACKGROUND OF THE INVENTION

1. Field of the Invention

The present invention relates to a semiconductor device suitable for use in a static induction thyristor, a GTO thyristor, etc., and to a method for producing the same. More specifically, the present invention relates to a semiconductor device containing an active high-resistance semiconductor layer (active intrinsic layer AIL), which exhibits high resistance and is effective at shortening the carrier lifetime, as well as to a method for producing the same.

2. Description of the Related Art

Static induction thyristors and static induction transistors have been developed and used practically as power semiconductor devices. For improving speed, lifetime control of such semiconductor devices has been carried out using electron beam irradiation, heavy metal doping, or the like. In general, in a case where a high-resistance semiconductor layer is not doped with an impurity, since crystalline perfection of the layer is increased, the lifetime is lengthened. Therefore, in this case, in a semiconductor device having a high-resistance semiconductor layer such as a static induction thyristor or a static induction transistor, advantageously, properties of the device can easily be controlled by selecting the device structure, and an original function based on the device structure can be obtained.

In the event that the high-resistance semiconductor layer is doped with an impurity, due to different lattice constants between the impurity atoms and the layer, the crystal is likely to become strained, thereby causing dislocations such as a misfit dislocation.

Lattice strains caused in vapor-phase growth of Si (silicon) due to an impurity concentration difference between a semiconductor substrate and a growth layer have been studied by Nishizawa et al. (see, J. Nishizawa, T. Terasaki, K. Yagi, and N. Miyamoto, "Perfect Crystal Growth of Silicon by Vapor Phase Epitaxy," J. Electrochemical Society, Vol. 122, No. 5, P. 664-669, 1975).

In a single Si crystal, the Si atoms are regularly arranged. In the case that the Si crystal is doped with an impurity, the Si atoms are replaced by impurity atoms, and since the impurity atoms are atoms having a covalent radius smaller than that of the Si atoms (such as boron (B) or phosphorus (P) atoms), the distance between the impurity atoms and the adjacent Si atoms is smaller than the distance between the Si atoms alone. Therefore, when a high concentration of B or P impurity atoms are added to a Si crystal, the doped Si crystal exhibits a lattice constant smaller than that of an intrinsic Si crystal. On the other hand, in the case that the impurity atoms are atoms having a covalent radius larger than that of the Si atoms (such as arsenic (As) or antimony (Sb) atoms), an opposite result is obtained (see, L. Pauling, "The Nature of Chemical Bonding," Cornell University Press, 1960, p. 205).

A semiconductor device having an active high-resistance layer (AIL) and a method for producing the same, which involves disposing p-type and n-type impurities at high concentrations in approximately the same positions to shorten the carrier lifetime, have been proposed. Such an active high-resistance layer can have a substantially high resistance, and can exhibit a shortened carrier lifetime due to the compensating effect of the p-type and n-type impurities. For example, when the semiconductor device is used as a diode, a transistor, a thyristor, an insulated gate device, or the like, a high switching speed, low loss, and low ON-resistance can be achieved (see, Japanese Laid-Open Patent Publication No. 2005-285955).

SUMMARY OF THE INVENTION

An object of the present invention is to further develop the concept of the semiconductor device described in Japanese Laid-Open Patent Publication No. 2005-285955, thereby providing a semiconductor device having a preferred structure containing an active high-resistance layer (AIL), which exhibits high resistance and is effective at shortening the carrier lifetime. The present invention also provides a method for producing the aforementioned semiconductor device.

[1] According to a first aspect of the invention, there is provided a semiconductor device containing a first conductive type semiconductor substrate, at least one cathode formed on one surface of the semiconductor substrate, an anode formed on another surface of the semiconductor substrate, and a gate electrode formed on the one surface of the semiconductor substrate to thereby control conduction of current between the cathode and the anode, the gate electrode being electrically insulated from the cathode, wherein the semiconductor device includes a first conductive type cathode segment disposed at least in a portion corresponding to the cathode in the one surface of the semiconductor substrate, a second conductive type anode segment disposed in a portion corresponding to the anode in the other surface of the semiconductor substrate, and a plurality of second conductive type embedded gate segments sandwiched between the cathode segment and the anode segment in the semiconductor substrate, and disposed in a portion closer to the cathode segment than to the anode segment, wherein the semiconductor device satisfies the condition $Db \leq (1/3) \times Da$, in which Da represents a distance between the top surface of the cathode segment and an end of the embedded gate segments facing the anode segment, and Db represents a distance between a highest-impurity concentration portion in the embedded gate segments and an end of the cathode segment facing the anode segment.

The distances Da and Db are selected based on the above condition. Consequently, when the anode-cathode state is converted from a forward bias state to a reverse bias state, the delay time can be shortened due to a minority-carrier storage effect. Furthermore, a gate-cathode reverse voltage can be prevented from rising rapidly in the reverse bias state, a gate-cathode reverse current can be reduced in order to slow a change (slope di/dt) in returning to the steady state, and gate-cathode fracturing can be prevented.

[2] In the first aspect of the invention, it is preferred that the semiconductor device satisfies the condition $(1/12) \times Da \leq Db \leq (1/3) \times Da$.

[3] In the first aspect of the invention, it is more preferred that the semiconductor device satisfies the condition $(1/10) \times Da \leq Db \leq (1/4) \times Da$.

[4] In the first aspect of the invention, it is further preferred that the semiconductor device satisfies the condition $(7/60) \times Da \leq Db \leq (13/60) \times Da$.

[5] In the first aspect of the invention, it is particularly preferred that the semiconductor device satisfies the condition $(3/20) \times Da \leq Db \leq (11/60) \times Da$.

[6] In the first aspect of the invention, it is preferred that the distance Da between the top surface of the cathode segment and the end of the embedded gate segments facing the anode segment is 4.0 to 14.0 µm.

[7] In the first aspect of the invention, it is more preferred that the distance Da is 4.0 to 10.0 µm.

[8] In the first aspect of the invention, it is further preferred that the distance Da is 4.0 to 8.0 µm.

[9] In the first aspect of the invention, it is particularly preferred that the distance Da is 5.0 to 7.0 µm.

[10] In the first aspect of the invention, it is preferred that a distance between the adjacent embedded gate segments is 0.5 to 2.0 µm. In this case, conduction of current between the cathode and the anode can readily be controlled by the gate electrode.

[11] In the first aspect of the invention, it is more preferred that the distance between the adjacent embedded gate segments is 0.5 to 1.5 µm.

[12] In the first aspect of the invention, it is further preferred that the distance between the adjacent embedded gate segments is 0.8 to 1.2 µm.

[13] In the first aspect of the invention, the semiconductor device may have an epitaxial layer on the semiconductor substrate, the epitaxial layer may contain at least a part of the embedded gate segments and the cathode segment, and the epitaxial layer may further contain an active high-resistance semiconductor segment disposed between the embedded gate segments and the cathode segment.

[14] In this case, preferably, the active high-resistance semiconductor segment has an impurity concentration having an order of magnitude of $10^{13}$ to $10^{15}$ [cm$^{-3}$], the highest-impurity concentration portion in the embedded gate segments has an impurity concentration having an order of magnitude of $10^{18}$ to $10^{20}$ [cm$^{-3}$], and a highest-impurity concentration portion in the cathode segment has an impurity concentration having an order of magnitude of $10^{18}$ to $10^{20}$ [cm$^{-3}$].

During the process of disposing the epitaxial layer on the semiconductor substrate, the active high-resistance semiconductor segment is formed, wherein the active high-resistance semiconductor segment is doped with a high concentration of a first conductive type impurity and a high concentration of a second conductive type impurity. Thus, the majority carrier lifetime and the minority carrier lifetime can effectively be shortened.

[15] According to a second aspect of the invention, a method for producing a semiconductor device is provided, containing a first conductive type semiconductor substrate, at least one cathode formed on one surface of the semiconductor substrate, an anode formed on another surface of the semiconductor substrate, and a gate electrode formed on the one surface of the semiconductor substrate to control current conduction between the cathode and the anode, the gate electrode being electrically insulated from the cathode, wherein the semiconductor device includes a first conductive type cathode segment disposed at least in a portion corresponding to the cathode in the one surface of the semiconductor substrate, a second conductive type anode segment disposed in a portion corresponding to the anode in the other surface of the semiconductor substrate, and a plurality of second conductive type embedded gate segments sandwiched between the cathode segment and the anode segment in the semiconductor substrate, and disposed in a portion closer to the cathode segment than to the anode segment. The method comprises the steps of forming a photomask having a plurality of openings on the one surface of the semiconductor substrate (first step), attaching a second conductive type impurity at least to a portion of the semiconductor substrate exposed in the openings to form an impurity layer on the portion (second step), performing low-temperature oxidation to remove a superficial layer of the impurity layer (third step), diffusing the impurity from the impurity layer to the semiconductor substrate to form a part of the embedded gate segments (fourth step), performing vapor-phase epitaxial growth using at least a first conductive type impurity and silicon to form a first epitaxial layer containing at least a part of the embedded gate segments and an active high-resistance semiconductor layer on the semiconductor substrate (fifth step), and forming a second epitaxial layer containing the cathode segment on the first epitaxial layer (sixth step).

In such a production method, an active high-resistance semiconductor segment, which has high resistance and is effective at shortening the carrier lifetime, can easily be formed between the embedded gate segments and the cathode segment. Particularly, in the first step, a portion, which ultimately will be converted into the active high-resistance semiconductor segment, can be protected by the photomask, whereby the portion can be prevented from becoming scratched. Although the impurity layer also is formed on the upper surface of the photomask in the second step, the portion, which will be converted into the active high-resistance semiconductor segment, can be protected by the photomask, the portion can be maintained in a crystalline form, and the portion can be prevented from becoming contaminated with impurities (metal). Furthermore, the concentration of impurities in the impurity layer can be controlled by removing the superficial layer in the third step, so that the active high-resistance semiconductor layer formed in the following fifth step can suitably be used as the intrinsic semiconductor segment. In addition, the production method is capable of easily producing a semiconductor device satisfying the condition $Db \leq (1/3) \times Da$, in which Da represents a distance between the top surface of the cathode segment and an end of the embedded gate segments facing the anode segment, and Db represents a distance between a highest-impurity concentration portion in the embedded gate segments and an end of the cathode segment facing the anode segment.

As described above, in the semiconductor device of the present invention, when the anode-cathode state is converted from a forward bias state to a reverse bias state, due to a minority-carrier storage effect, the delay time can be shortened. Furthermore, a gate-cathode reverse voltage can be prevented from rising rapidly in a reverse bias state, and a gate-cathode reverse current can be reduced in order to slow a change (slope di/dt) in returning to a steady state condition, whereby fracturing of the gate-cathode can be prevented.

In the semiconductor device production method of the invention, an active high-resistance semiconductor segment, which has high resistance and is effective at shortening the carrier lifetime, can easily be formed between the embedded gate segments and the cathode segment. In addition, the production method is capable of easily producing a semiconductor device that satisfies the condition $Db \leq (1/3) \times Da$, in which Da represents a distance between the top surface of the cathode segment and an end of the embedded gate segments facing the anode segment, and Db represents a distance between a highest-impurity concentration portion in the embedded gate segments and an end of the cathode segment facing the anode segment.

The above and other objects, features, and advantages of the present invention will become more apparent from the following description when taken in conjunction with the accompanying drawings in which a preferred embodiment of the present invention is shown by way of illustrative example.

DETAILED DESCRIPTION OF THE INVENTION

An embodiment of the semiconductor device of the present invention, which can be used in a normally-off embedded gate-type static induction thyristor or the like, will be described below with reference to FIGS. 1 to 7.

Figure 1:
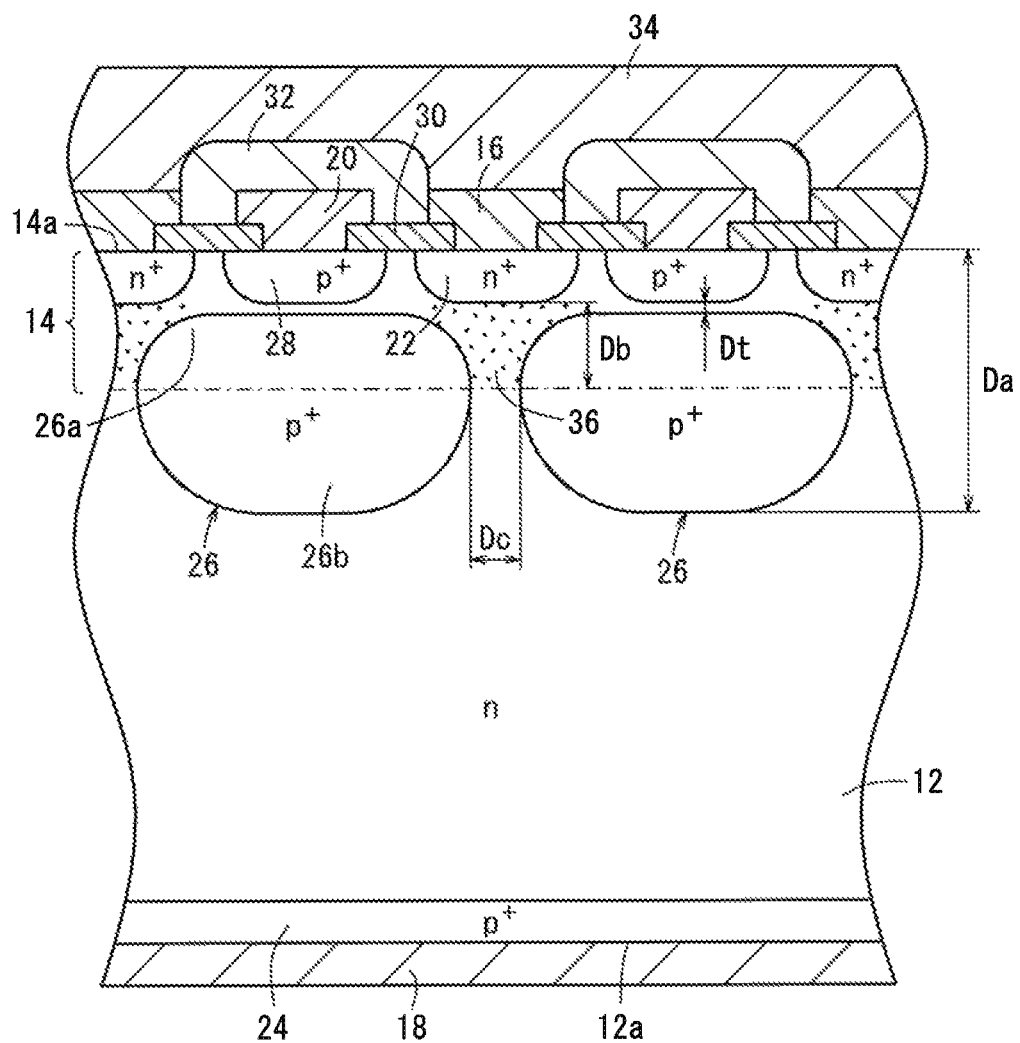
FIG. 1 is a partial cross-sectional view showing a principal part in a semiconductor device according to an embodiment of the present invention.

As shown in FIG. 1, a semiconductor device 10 according to the present embodiment contains a first conductive type (e.g., n-type) semiconductor substrate 12, an epitaxial layer 14 formed on the semiconductor substrate 12, one or more cathodes 16 (e.g., containing a metal layer) formed on the top surface 14a of the epitaxial layer 14, at least one anode 18 (e.g., containing a metal layer) formed on the back surface 12a of the semiconductor substrate 12, and one or more gate electrodes 20 (e.g., containing a metal layer) formed on the top surface 14a of the epitaxial layer 14 in order to control conduction of current between the cathodes 16 and the anode 18. The gate electrodes 20 are electrically insulated from the cathodes 16.

In the semiconductor device 10, first conductive type (e.g., n-type) cathode segments 22 are disposed in the top surface 14a of the epitaxial layer 14 at least in portions thereof corresponding to the cathodes 16. Further, a second conductive type (e.g., p-type) anode segment 24 is disposed in the back surface 12a of the semiconductor substrate 12 in a portion thereof corresponding to the anode 18.

Furthermore, in the semiconductor substrate 12, a plurality of second conductive type embedded gate segments 26 are sandwiched between the cathode segments 22 and the anode segment 24. The embedded gate segments 26 are disposed in respective portions, which are closer to the cathode segments 22 than to the anode segment 24, and the embedded gate segments 26 are electrically connected to the gate electrodes 20. The embedded gate segments 26 are arranged at a substantially constant arrangement pitch. First conductive type channel segments are disposed between respective adjacent embedded gate segments 26. Second conductive type takeoff segments 28 are disposed between the embedded gate segments 26 and the gate electrodes 20, so as to provide electrical connections between the embedded gate segments 26 and the gate electrodes 20. First insulating layers 30 are interposed between the gate electrodes 20 and the cathode segments 22, and second insulating layers 32 are interposed between the gate electrodes 20 and the cathodes 16. Although first conductive type portions are interposed between the embedded gate segment 26 and the takeoff segment 28, the distance Dt between the embedded gate segment 26 and the takeoff segment 28 is such that the embedded gate segment 26 and the takeoff segment 28 can be electrically connected. A cathode connection layer 34 is formed on the cathodes 16 in order to electrically connect the cathodes 16 to each other.

Active intrinsic type high-resistance semiconductor segments (active intrinsic layers, hereinafter referred to as AILs 36), which have high resistance and are effective at shortening the carrier lifetime, are formed between the embedded gate segments 26 and the cathode segments 22. More specifically, each AIL 36 is sandwiched between respective adjacent embedded gate segments 26, and each AIL 36 is located between a lower end of the cathode segment 22 (an end facing toward the anode segment 24) and a boundary between the semiconductor substrate 12 and the epitaxial layer 14.

In the semiconductor device 10, upper portions 26a of the embedded gate segments 26, the cathode segments 22, the takeoff segments 28, and the AILs 36 are formed in the epitaxial layer 14 by an epitaxial growth process. Stated otherwise, the semiconductor device 10 includes the epitaxial layer 14 on the semiconductor substrate 12, and the epitaxial layer 14 contains portions (i.e., upper portions 26a) of the embedded gate segments 26, the takeoff segments 28, the cathode segments 22, and the AILs 36. More specifically, each of the AILs 36 is sandwiched between respective adjacent embedded gate segments 26, and each of the AILs 36 is located between a lower end of the cathode segment 22 (an end facing toward the anode segment 24) and a boundary between the semiconductor substrate 12 and the epitaxial layer 14.

Since the upper portion 26a of the embedded gate segment 26 is formed in the epitaxial layer 14, a portion having a highest impurity concentration (i.e., a highest-impurity concentration portion) in the embedded gate segment 26 corresponds to the center of the embedded gate segment 26 at the boundary between the semiconductor substrate 12 and the epitaxial layer 14.

Assuming that Da represents a (vertical) distance between the top surface of the cathode segment 22 (the top surface 14a of the epitaxial layer 14) and the lower end of the embedded gate segment 26 (i.e., an end thereof facing toward the anode segment 24), and that Db represents a (vertical) distance between the highest-impurity concentration portion in the embedded gate segment 26 and the lower end of the cathode segment 22 (i.e., an end thereof facing toward the anode segment 24), the semiconductor device 10 satisfies the condition $Db \leq (1/3) \times Da$.

The semiconductor device 10 preferably satisfies the condition $(1/12) \times Da \leq Db \leq (1/3) \times Da$, more preferably, satisfies the condition $(1/10) \times Da \leq Db \leq (1/4) \times Da$, further preferably, satisfies the condition $(7/60) \times Da \leq Db \leq (13/60) \times Da$, and particularly preferably, satisfies the condition $(3/20) \times Da \leq Db \leq (11/60) \times Da$.

In this case, the distance Da between the top surface of the cathode segment 22 and the lower end of the embedded gate segment 26 that faces toward the anode segment 24 preferably is 4.0 to 14.0 μm, more preferably, is 4.0 to 10.0 μm, further preferably, is 4.0 to 8.0 μm, and particularly preferably, is 5.0 to 7.0 μm.

In the semiconductor device 10, the distances Da and Db are selected under the above conditions. Consequently, when the anode-cathode state is converted from a forward bias state to a reverse bias state, the delay time can be shortened due to a minority-carrier storage effect. Furthermore, a gate-cathode reverse voltage can be prevented from rising rapidly in the reverse bias state. Further, a gate-cathode reverse current can be reduced in order to slow a change (slope di/dt) in returning to the steady state, and gate-cathode fracturing can be prevented.

The distance Dc between the adjacent embedded gate segments 26 preferably is 0.5 to 2.0 μm, more preferably, is 0.5 to 1.5 μm, and further preferably, is 0.8 to 1.2 μm. In this case, conduction of current between the cathodes 16 and the anode 18 can readily be controlled by the gate electrodes 20.

An advantageous effect, which is achieved by controlling the distances Da and Db based on the above conditions, will be described below.

According to one reference example, a semiconductor device 100 satisfies the relationship Db/Da=½ between the distance Da and the distance Db. The structure of the semiconductor device 100 is shown in FIG. 2, whereas reverse recovery characteristics of the semiconductor device 100 are shown in FIG. 3.

Figure 2:
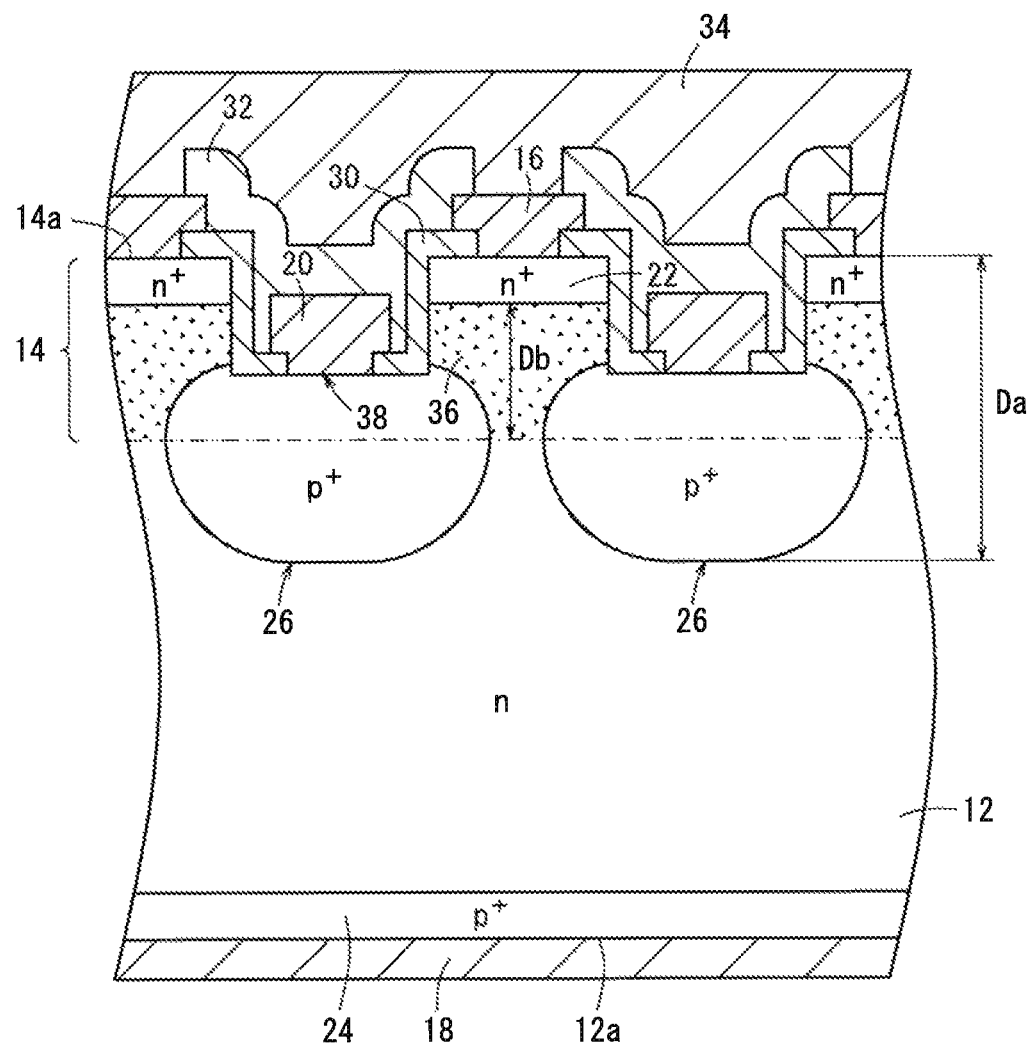
FIG. 2 is a partial cross-sectional view showing a principal part in a semiconductor device according to a reference example.

As shown in FIG. 2, the semiconductor device 100 according to the reference example has mesa-etched grooves 38 extending to the embedded gate segments 26. The gate electrodes 20 are formed in the mesa-etched grooves 38 (grooves), whereas the cathodes 16 are formed on (lands of) the epitaxial layer 14.

Figure 3:
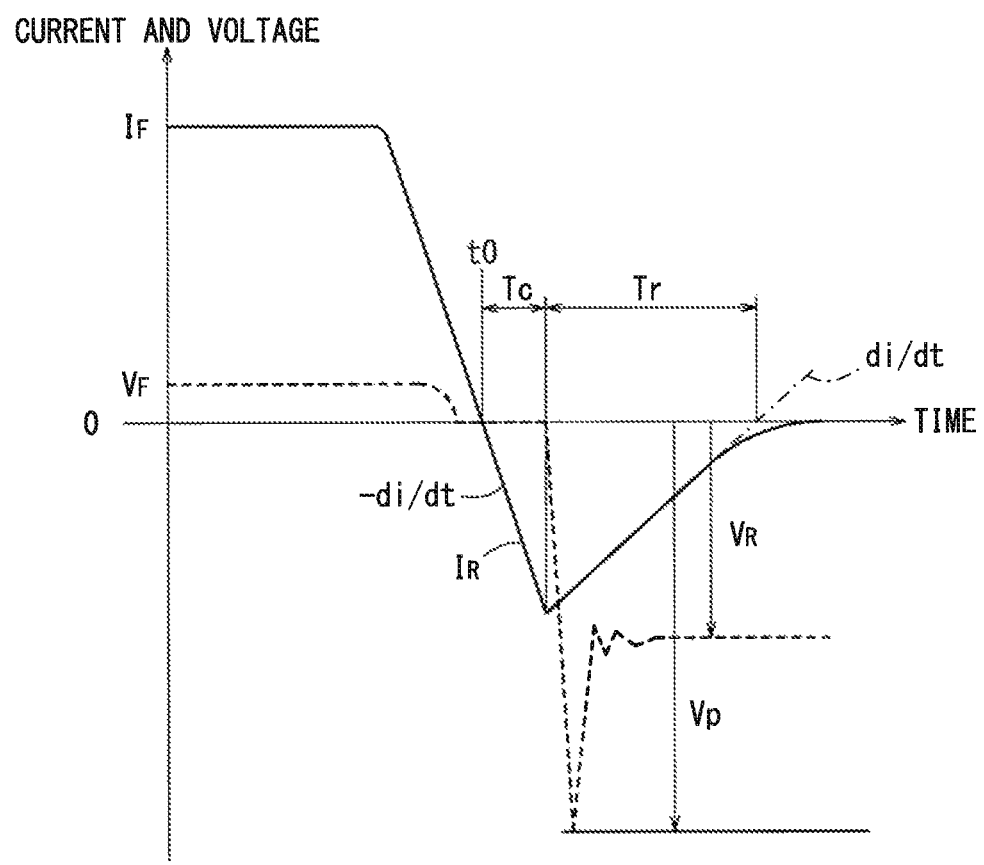
FIG. 3 is a graph illustrating reverse recovery characteristics of a semiconductor device according to the reference example.

Further, in the semiconductor device 100 according to the reference example, at time t0 shown in FIG. 3, when the anode-cathode state is converted from a forward bias state to a reverse bias state, electrons (majority carriers), which are stored in the AILs 36, are returned to the cathode segments 22, and holes (minority carriers), which are stored in the AILs 36, are returned to the embedded gate segments 26. As a result of the holes, a diffusion current is generated, which leads to the flow of a gate-cathode reverse current $I_R$. Over a given time Tc, the absolute value of the reverse current $I_R$ increases. The time Tc generally is referred to as a storage time Tc. After the storage time Tc, the minority carriers become reduced, whereby the absolute value of the reverse current $I_R$ also is gradually reduced. Upon elapse of a given time Tr, the semiconductor device 100 is returned to the steady state. The time Tr is generally referred to as a decay time Tr.

During the storage time Tc, a large change (slope–di/dt) of the reverse current $I_R$ is observed. Therefore, if the storage time Tc is too long, a gate-cathode reverse voltage $V_R$ increases sharply in the form of a pulse, resulting in a large (absolute) peak value Vp. As a result, the risk of gate-cathode fracturing is increased.

In order to solve this problem, it is necessary to shorten the minority carrier lifetime (life cycle). One method for shortening the minority carrier lifetime comprises injecting an impurity, such as gold (Au) or the like, in order to form a recombination center.

Figure 4:
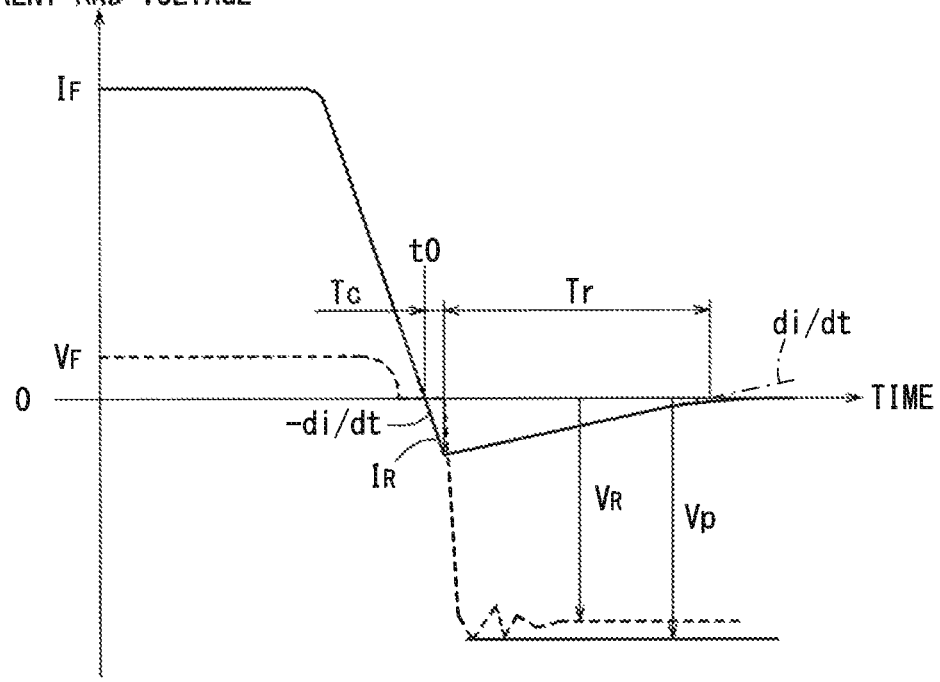
FIG. 4 is a graph illustrating reverse recovery characteristics of a semiconductor device according to the present embodiment.

Reverse recovery characteristics of the semiconductor device 10 according to the present embodiment are shown in FIG. 4. The semiconductor device 10 satisfies the above-described preferred relationship between the distances Da and Db. Therefore, the gate-cathode distance (width) in each of the AILs 36 is reduced, whereby the transfer distance of holes (which are stored in the AIL 36 in a forward bias state) is reduced in the reverse bias state, thereby shortening the storage time Tc. As described above, during the storage time Tc, a large change (slope–di/dt) in the reverse current $I_R$ is observed. In the present embodiment, since the storage time Tc is shortened, the (absolute) peak value of the reverse current $I_R$ is reduced, whereby the change in the reverse current (slope di/dt) also is reduced during the decay time Tr. Consequently, the (absolute) peak value Vp of the gate-cathode reverse voltage $V_R$ is reduced, and gate-cathode fracturing caused by the reverse current $I_R$ can effectively be prevented. It should be noted that the storage time Tc can further be shortened by injecting an impurity, such as gold (Au) or the like, in order to form a recombination center.

For example, in the semiconductor device 10, the semiconductor substrate 12 is an n-type silicon substrate having an impurity concentration having an order of magnitude of $10^{13}$ [cm$^{-3}$], the highest-impurity concentration portion in the second conductive type embedded gate segment 26 has an impurity concentration having an order of magnitude of $10^{18}$ to $10^{20}$ [cm$^{-3}$], the highest-impurity concentration portion in the first conductive type cathode segment 22 has an impurity concentration having an order of magnitude of $10^{18}$ to $10^{28}$ [cm$^{-3}$], and the AIL 36 has an impurity concentration having an order of magnitude of $10^{13}$ to $10^{15}$ [cm$^{3}$].

In this case, during the process of disposing the epitaxial layer 14 on the semiconductor substrate 12, the AIL 36 is formed, which is doped with a high concentration of a first conductive type impurity and a high concentration of a second conductive type impurity. Thus, as described in Japanese Laid-Open Patent Publication No. 2005-285955, the majority carrier lifetime and the minority carrier lifetime can be shortened.

For example, the first insulating layer 30 comprises a $SiO_2$ film, and the second insulating layer 32 comprises a $SiN_X$ film, a polyimide film, or a silicone film. Further, the cathode 16, the anode 18, and the gate electrode 20 contain aluminum (Al).

Two modified examples of the semiconductor device 10 according to the present embodiment will be described below with reference to FIGS. 5 and 6.

Figure 5:
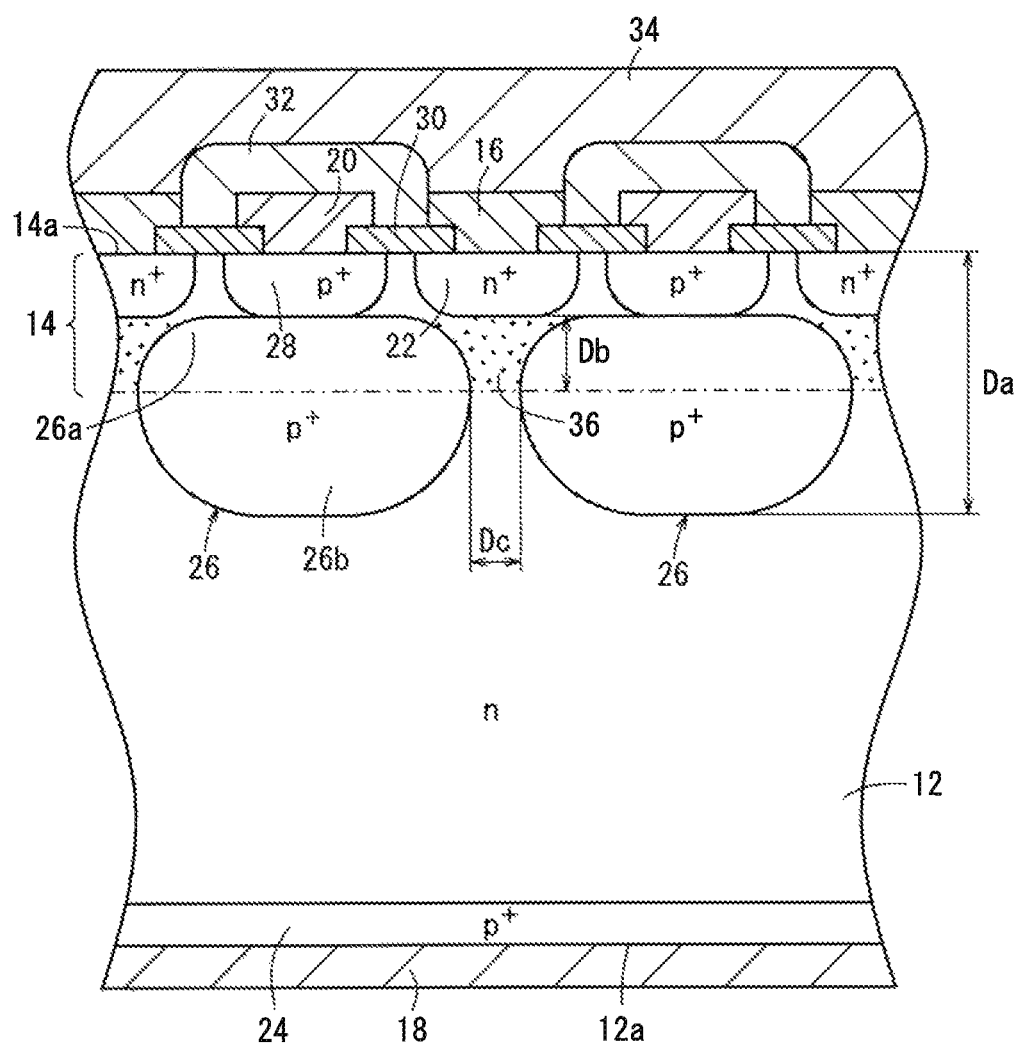
FIG. 5 is a partial cross-sectional view showing a principal part in a semiconductor device according to a first modified example.

As shown in FIG. 5, a semiconductor device 10a according to a first modified example is roughly the same as the above-described semiconductor device 10, but differs therefrom in that top portions of the embedded gate segments 26 are placed in contact with bottom portions of the takeoff segments 28.

Figure 6:
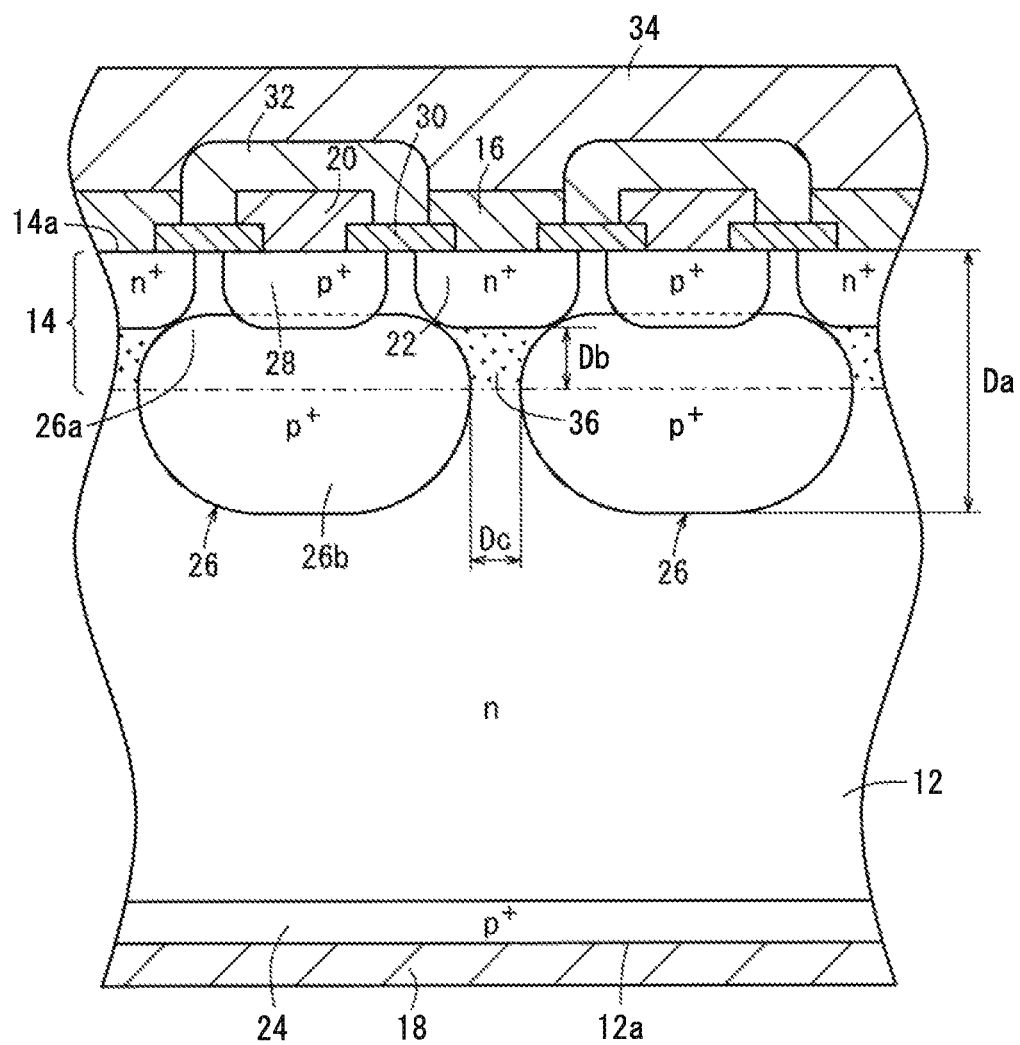
FIG. 6 is a partial cross-sectional view showing a principal part in a semiconductor device according to a second modified example.

As shown in FIG. 6, a semiconductor device 10b according to a second modified example is roughly the same as the above-described semiconductor device 10, but differs therefrom in that top portions of the embedded gate segments 26 overlap with bottom portions of the takeoff segments 28.

A method for producing the semiconductor device according to the present embodiment will be described below with reference to the flowchart of FIG. 7.

Figure 7:
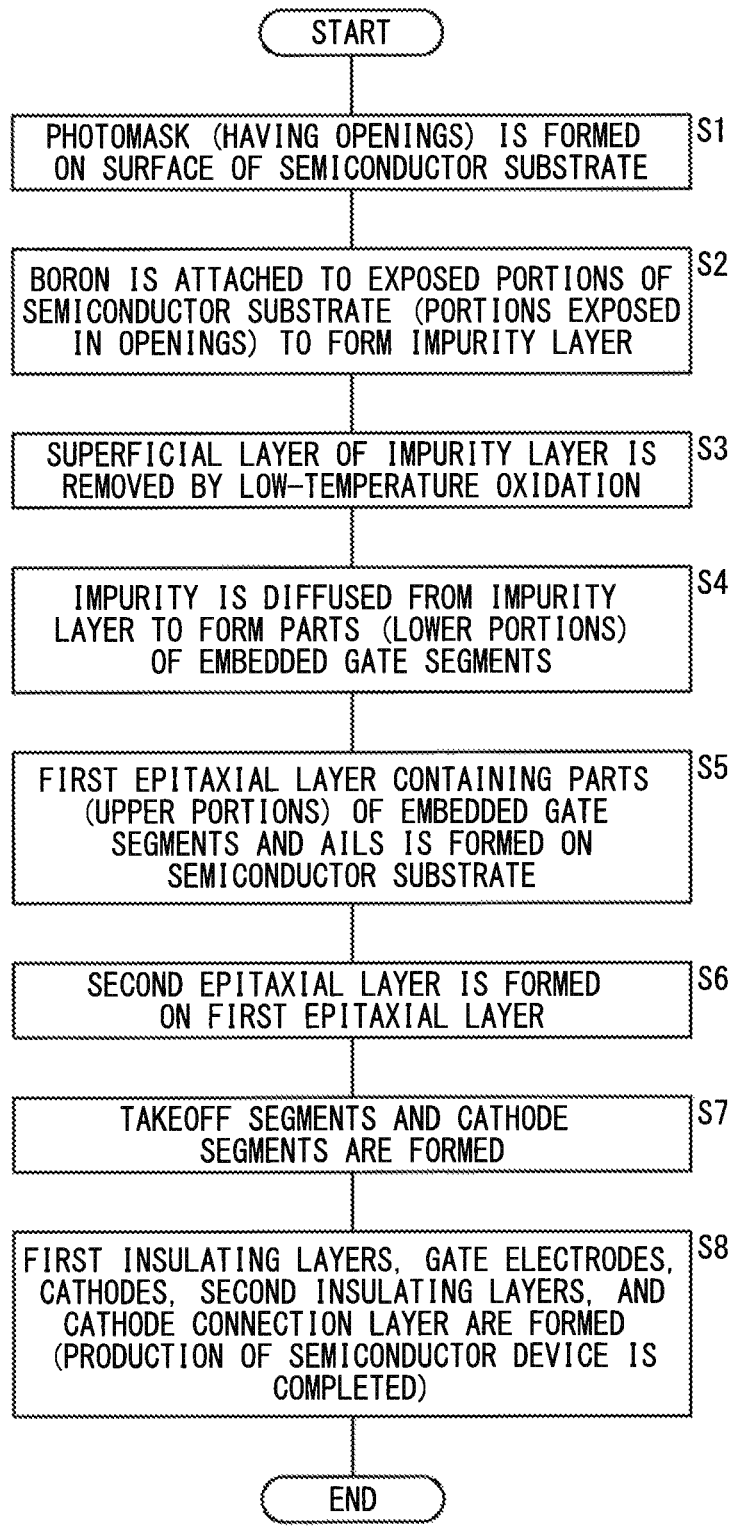
FIG. 7 is a flowchart of a method for producing the semiconductor device according to the present embodiment.

First, in step S1 of FIG. 7, a photomask having a plurality of openings therein is formed on the top surface of the semiconductor substrate 12. The openings are located at positions corresponding to centers of the embedded gate segments 26 in the top surface of the semiconductor substrate 12. Therefore, such portions, which ultimately will be converted into the AILs 36, are protected by the photomask. Thus, such portions can be prevented from becoming scratched.

In step S2, a second conductive type impurity (such as boron or the like) is attached at least to exposed portions of the semiconductor substrate 12 (portions thereof which are exposed in the openings of the photomask), whereby an impurity layer (such as a metallic boron layer) is formed on the exposed portions. The impurity layer has an impurity concentration having an order of magnitude of $10^{22}$ [cm$^{-3}$]. Boron is attached at a temperature of 1000° C. to 1100° C., e.g. 1011° C. In this step, boron also becomes attached to the upper surface of the photomask, and thus an impurity layer (such as a metallic boron layer) also is formed on the upper surface. Portions corresponding to the AILs 36 can be protected by the photomask, so that the crystalline state of such portions can be maintained, and the portions can be prevented from becoming contaminated with metal.

In step S3, a superficial layer of the impurity layer is removed by low-temperature oxidation. In the case that a metallic boron layer is used as the impurity layer, low-temperature oxidation is carried out thereon at a temperature of 850° C. to 950° C. (e.g. 900° C.) in order to remove the superficial layer (having a thickness of 5 to 15 nm) of the metallic boron layer. In the present embodiment, the superficial layer, which is removed, has an impurity concentration having an order of magnitude of $10^{22}$ [cm$^{-3}$] and a thickness of 10 nm. The residual impurity layer (metallic boron layer) that remains in the openings has an impurity concentration having an order of magnitude of $10^{20}$ [cm$^{-3}$].

In step S4, the impurity (boron) is diffused from the impurity layer (metallic boron layer) to the semiconductor substrate 12 in order to form lower portions 26b of the embedded gate segments 26. The diffusion process may be performed at a temperature of 1100° C. to 1200° C. (e.g. 1150° C.).

In step S5, vapor-phase epitaxial growth is carried out using at least a first conductive type impurity (such as phosphorus or the like) and silicon, whereby a first epitaxial layer containing at least the upper portions 26a of the embedded gate segments 26 and the AILs 36 (a lower layer in the epitaxial layer 14) is formed on the semiconductor substrate 12. During the vapor-phase epitaxial growth process using phosphorus (P) and silicon (Si), boron (B) atoms in the lower portions 26b of the embedded gate segments 26 are emitted in a vapor phase. The upper portions 26a of the embedded gate segments 26 are formed as a result of boron being emitted mainly in a vertical direction and by silicon in the vapor phase. The AILs 36 are formed as a result of boron being emitted mainly in a horizontal direction and by silicon and phosphorus in the vapor phase. Thus, the AILs 36 are capable of exhibiting a compensating effect due to the presence of boron and phosphorus. The first epitaxial layer is formed at a temperature of 1000° C. to 1100° C. (e.g. 1050° C.). In the semiconductor device 10 of FIG. 1, as well as in the semiconductor device 10a of FIG. 5, following step S5, formation of the embedded gate segments 26 is completed.

In a case where step S3 is not carried out in order to remove the superficial layer of the impurity layer, since the superficial layer has an impurity concentration having an order of magnitude of $10^{22}$ [cm$^{-3}$], the amount of diffused boron is increased. Therefore, it may be difficult to use the AILs 36 as intrinsic semiconductor segments. In contrast, in the present embodiment, since the impurity concentration of the impurity layer is controlled at an order of magnitude of $10^{20}$ [cm$^{-3}$] by removing the superficial layer in step S3, the AILs 36 formed in step S5 can suitably be used as intrinsic semiconductor segments.

In step S6, a second epitaxial layer (an upper layer in the epitaxial layer 14) is formed by epitaxial growth on the first epitaxial layer. During this step, in the semiconductor device 10b shown in FIG. 6, formation of the embedded gate segments 26 is completed. Although phosphorus is diffused in a downward direction during this step, the phosphorus acts as an impurity compensating material, thus enabling the AILs 36 to be used as intrinsic segments.

In step S7, the takeoff segments 28 are formed in the second epitaxial layer in portions thereof corresponding to the embedded gate segments 26. Further, the cathode segments 22 are formed in the second epitaxial layer in portions thereof corresponding to the AILs 36. Consequently, the second epitaxial layer, which contains the cathode segments 22, is formed on the first epitaxial layer.

In step S8, the first insulating layers 30, the gate electrodes 20, the cathodes 16, the second insulating layers 32, and the cathode connection layer 34 are formed on the epitaxial layer 14. Following formation thereof, production of the semiconductor device 10, 10a, or 10b is completed.

In the production method, AILs 36, which have a high resistance and are effective at shortening the carrier lifetime, can easily be formed in the embedded gate segments 26 and the cathode segments 22. In addition, the production method is capable of easily producing the semiconductor devices 10, 10a, and 10b according to the present embodiment and the first and second modified examples, in which the semiconductor devices 10, 10a, and 10b satisfy the above-described relationship between the distances Da and Db.

First Example

In a First Example, in each of semiconductor devices according to the Reference Example and Examples 1 to 9, a reverse voltage, which was generated by converting the forward bias state into a reverse bias state, was measured. The measured reverse voltage was represented by an absolute value of the peak value Vp throughout all of the examples. More specifically, a rated current of 30 A was applied as a forward current $I_F$ (see FIG. 4), followed by applying a reverse bias, and the reverse voltage Vp was measured. Characteristic values and measurement results according to the Reference Example and Examples 1 to 9 are shown in Table 1. It should also be noted, in the Reference Example and in Examples 1 to 9, each of the AILs 36 was doped with gold (Au) at 50 atm.

Reference Example

In the semiconductor device according to the Reference Example, the distance Da was 18 μm, the distance Db was 9 μm, and the distances Da and Db satisfied the relationship Db/Da=½.

Example 1

In the semiconductor device according to Example 1, the distance Da was 6 μm, the distance Db was 2.0 μm, and the distances Da and Db satisfied the relationship Db/Da=⅓.

Examples 2 to 9

In each of the semiconductor devices according to Examples 2, 3, 4, 5, 6, 7, 8, and 9, the distance Da was 6 μm, the distance Db was 1.5, 1.3, 1.1, 1.0, 0.9, 0.7, 0.6, or 0.5 μm, respectively, and the distances Da and Db satisfied the relationship Db/Da=¼, 13/60, 11/60, ⅙, 3/20, 7/60, 1/10, or 1/12, respectively.

TABLE 1

|  | Distance Da [μm] | Distance Db [μm] | Db/Da | Reverse voltage Vp [kV] |
| --- | --- | --- | --- | --- |
| Reference Example | 18.0 | 9.0 | 1/2 | 3.0 |
| Example 1 | 6.0 | 2.0 | 1/3 | 2.4 |
| Example 2 | 6.0 | 1.5 | 1/4 | 2.2 |
| Example 3 | 6.0 | 1.3 | 13/60 | 2.0 |
| Example 4 | 6.0 | 1.1 | 11/60 | 1.9 |
| Example 5 | 6.0 | 1.0 | 1/6 | 1.8 |
| Example 6 | 6.0 | 0.9 | 3/20 | 1.8 |
| Example 7 | 6.0 | 0.7 | 7/60 | 2.0 |
| Example 8 | 6.0 | 0.6 | 1/10 | 2.2 |
| Example 9 | 6.0 | 0.5 | 1/12 | 2.5 |

As shown in Table 1, when a rated current of 30 A was applied as the forward current followed by application of the reverse bias, the semiconductor device according to the Reference Example exhibited a reverse voltage of 3 kV. On the other hand, the semiconductor devices according to Examples 1 to 9 exhibited reverse voltages, which were lower than that of the Reference Example. In particular, since the Db/Da value was reduced to 3/20, the reverse voltage was lowered (see Examples 1 to 6). Moreover, when the Db/Da value was reduced below 3/20, the reverse voltage gradually increased (see Examples 7 to 9). Thus, it may be considered that there was a limit on how short the storage time could be reduced, and that a Db/Da value lower than 3/20 did not lead to shortening of the storage time, but resulted in a reduction in pressure resistance. Further, when the Db/Da value was reduced below 1/12, the resistance of the AIL was lowered, and disadvantageously, ON-resistance was increased.

Thus, the distances Da and Db preferably satisfy the relationship Db≤(1/3)×Da.

Furthermore, it is clear from the results of Examples 1 to 9 that the distances Da and Db preferably satisfy the relationship (1/12)×Da≤Db≤(1/3)×Da, more preferably, satisfy the relationship (1/10)×Da≤Db≤(1/4)×Da, further preferably, satisfy the relationship (7/60)×Da≤Db≤(13/60)×Da, and particularly preferably, satisfy the relationship (3/20)×Da≤Db≤(11/60)×Da.

Second Example

In a Second Example, in each of semiconductor devices according to Examples 10 to 18 and Reference Examples 1 and 2, which had various distances Da, and Db/Da relationships of 1/12, 1/6, and 1/3, respectively, a reverse voltage, which was generated by converting the forward bias state into a reverse bias state, was measured. In the same manner as the First Example, a rated current of 30 A was applied as a forward current, followed by applying a reverse bias, and the reverse voltage was measured. Characteristic values and measurement results according to Examples 10 to 18 and Reference Examples 1 and 2 are shown in Table 2. It should also be noted, in Examples 10 to 18 and in Reference Examples 1 and 2, each of the AILs was doped with gold (Au) at 50 atm.

Example 10

In Example 10, three semiconductor devices having respective distance Db/Da relationships of 1/12, 1/6, and 1/3 were produced, and the reverse voltages of the devices were measured, respectively. The semiconductor devices of Example 10 had the same distance Da of 4 μm, and had different distances Db of 0.33 μm (Db/Da=1/12), 0.67 μm (Db/Da=1/6), and 1.33 μm (Db/Da=1/3), respectively.

Examples 11 to 18

The semiconductor devices according to Examples 11, 12, 13, 14, 15, 16, 17, and 18 had distances Da of 5, 6, 7, 8, 9, 10, 12, and 14 μm, respectively. In each of such examples, in the same manner as Example 10, three semiconductor devices having respective distance Db/Da relationships of 1/12, 1/6, and 1/3 were produced, and the reverse voltages of the devices were measured, respectively.

Reference Examples 1 and 2

The semiconductor devices according to Reference Examples 1 and 2 had distances Da of 16 and 18 μm, respectively. In each of such examples, in the same manner as Example 10, three semiconductor devices, having respective distance Db/Da relationships of 1/12, 1/6, and 1/3 were produced, and the reverse voltages of the devices were measured, respectively.

TABLE 2

|  | | Db/Da = 1/12 | | Db/Da = 1/6 | | Db/Da = 1/3 | |
| --- | --- | --- | --- | --- | --- | --- | --- |
|  | Distance Da [μm] | Distance Db [μm] | Reverse voltage [kV] | Distance Db [μm] | Reverse voltage [kV] | Distance Db [μm] | Reverse voltage [kV] |
| Example 10 | 4.0 | 0.33 | 2.8 | 0.67 | 2.1 | 1.33 | 2.0 |
| Example 11 | 5.0 | 0.42 | 2.6 | 0.83 | 1.9 | 1.67 | 2.3 |
| Example 12 | 6.0 | 0.50 | 2.5 | 1.00 | 1.8 | 2.00 | 2.4 |
| Example 13 | 7.0 | 0.58 | 2.3 | 1.17 | 1.9 | 2.33 | 2.5 |
| Example 14 | 8.0 | 0.67 | 2.3 | 1.33 | 2.1 | 2.67 | 2.6 |
| Example 15 | 9.0 | 0.75 | 1.9 | 1.50 | 2.2 | 3.00 | 2.7 |
| Example 16 | 10.0 | 0.83 | 1.8 | 1.67 | 2.3 | 3.33 | 2.7 |
| Example 17 | 12.0 | 1.00 | 1.8 | 2.00 | 2.4 | 4.00 | 2.8 |
| Example 18 | 14.0 | 1.17 | 1.9 | 2.33 | 2.5 | 4.66 | 2.8 |
| Reference Example 1 | 16.0 | 1.33 | 2.1 | 2.67 | 2.6 | 5.33 | 3.0 |
| Reference Example 2 | 18.0 | 1.50 | 2.2 | 3.00 | 2.7 | 6.00 | 3.0 |

As shown in Table 2, in the semiconductor device having a Db/Da value of 1/3 according to Reference Example 1, a reverse voltage of 3.0 kV was exhibited, which is equal to that of the Reference Example according to the First Example. Further, in the semiconductor devices having the Db/Da values of 1/6 and 1/3 according to Reference Example 2, a reverse voltage of 3.0 kV was exhibited, which is equal to that of the Reference Example according to the First Example. The semiconductor devices of Examples 10 to 18 also exhibited excellent reverse voltages having values lower than 3.0 kV. In particular, excellent results were exhibited in Examples 12 to 14, in which semiconductor devices were produced having distance values of Da and Db satisfying the relationship Db/Da=1/12 to 1/3.

Thus, it is clear from the above results that the distance Da preferably should be 4.0 to 14.0 μm, more preferably, should be 4.0 to 10.0 μm, further preferably, should be 4.0 to 8.0 μm, and particularly preferably, should be 5.0 to 7.0 μm.

It should be understood that the semiconductor device of the present invention is not limited to the above embodiment, and various changes and modifications may be made to the embodiment without departing from the scope of the present invention as set forth in the appended claims.

What is claimed is:

1. A semiconductor device comprising:
   a first conductive type semiconductor substrate;
   at least one cathode formed on one surface of the semiconductor substrate;
   an anode formed on another surface of the semiconductor substrate; and
   a gate electrode formed on the one surface of the semiconductor substrate to thereby control conduction of current between the cathode and the anode, the gate electrode being electrically insulated from the cathode;
   wherein the semiconductor device includes:
   a first conductive type cathode segment disposed at least in a portion corresponding to the cathode in the one surface of the semiconductor substrate;
   a second conductive type anode segment disposed in a portion corresponding to the anode in the other surface of the semiconductor substrate; and
   a plurality of second conductive type embedded gate segments sandwiched between the cathode segment and the anode segment in the semiconductor substrate, and disposed in a portion closer to the cathode segment than to the anode segment; and
   wherein the semiconductor device satisfies the following condition:

$$Db \leq (1/3) \times Da,$$

in which Da represents a distance between the top surface of the cathode segment and an end of the embedded gate segments facing the anode segment, and Db represents a distance between a highest-impurity concentration portion in the embedded gate segments and an end of the cathode segment facing the anode segment,
   the semiconductor device has an epitaxial layer on the semiconductor substrate;
   the epitaxial layer contains at least a part of the embedded gate segments and the cathode segment; and
   the epitaxial layer further contains an active intrinsic layer disposed between the embedded gate segments and the cathode segment, the active intrinsic layer being formed in a growth process of the epitaxial layer by being doped with a high concentration of a first conductive type impurity and a high concentration of a second conductive type impurity.

2. The semiconductor device according to claim 1, wherein the semiconductor device satisfies the condition $(1/12) \times Da \leq Db \leq (1/3) \times Da$.

3. The semiconductor device according to claim 2, wherein the semiconductor device satisfies the condition $(1/10) \times Da \leq Db \leq (1/4) \times Da$.

4. The semiconductor device according to claim 3, wherein the semiconductor device satisfies the condition $(7/60) \times Da \leq Db \leq (13/60) \times Da$.

5. The semiconductor device according to claim 4, wherein the semiconductor device satisfies the condition $(3/20) \times Da \leq Db \leq (11/60) \times Da$.

6. The semiconductor device according to claim 1, wherein the distance Da between the top surface of the cathode segment and the end of the embedded gate segments facing the anode segment is 4.0 to 14.0 μm.

7. The semiconductor device according to claim 6, wherein the distance Da is 4.0 to 10.0 μm.

8. The semiconductor device according to claim 7, wherein the distance Da is 4.0 to 8.0 μm.

9. The semiconductor device according to claim 8, wherein the distance Da is 5.0 to 7.0 μm.

10. The semiconductor device according to claim 1, wherein a distance between the adjacent embedded gate segments is 0.5 to 2.0 μm.

11. The semiconductor device according to claim 10, wherein the distance between the adjacent embedded gate segments is 0.5 to 1.5 μm.

12. The semiconductor device according to claim 11, wherein the distance between the adjacent embedded gate segments is 0.8 to 1.2 μm.

13. The semiconductor device according to claim 1, wherein:
   the active high-resistance semiconductor segment has an impurity concentration having an order of magnitude of $10^{13}$ to $10^{15}$ [cm$^{-3}$];
   the highest-impurity concentration portion in the embedded gate segments has an impurity concentration having an order of magnitude of $10^{18}$ to $10^{20}$ [cm$^{-3}$]; and
   a highest-impurity concentration portion in the cathode segment has an impurity concentration having an order of magnitude of $10^{18}$ to $10^{20}$ [cm$^{-3}$].

14. A method for producing a semiconductor device comprising:
   a first conductive type semiconductor substrate;
   at least one cathode formed on one surface of the semiconductor substrate;
   an anode formed on another surface of the semiconductor substrate; and
   a gate electrode formed on the one surface of the semiconductor substrate to thereby control conduction of current between the cathode and the anode, the gate electrode being electrically insulated from the cathode,
   wherein the semiconductor device includes:
   a first conductive type cathode segment disposed at least in a portion corresponding to the cathode in the one surface of the semiconductor substrate;
   a second conductive type anode segment disposed in a portion corresponding to the anode in the other surface of the semiconductor substrate; and
   a plurality of second conductive type embedded gate segments sandwiched between the cathode segment and the anode segment in the semiconductor substrate, and disposed in a portion closer to the cathode segment than to the anode segment;
   wherein the semiconductor device satisfies the following condition:

$$Db \leq (1/3) \times Da,$$

in which Da represents a distance between the top surface of the cathode segment and an end of the embedded gate segments facing the anode segment, and Db represents a distance between a highest-impurity concentration portion in the embedded gate segments and an end of the cathode segment facing the anode segment,
   the semiconductor device has an epitaxial layer on the semiconductor substrate;
   the epitaxial contains at least a part of the embedded gate segments and the cathode segment; and
   the epitaxial layer further contains an active intrinsic layer disposed between the embedded gate segments and the cathode segment, the active intrinsic layer being formed in a growth process of the epitaxial layer by being doped with a high concentration of a first conductive type impurity and a high concentration of a second conductive type impurity;
   the method comprising the steps of:
   forming a photomask having a plurality of openings on the one surface of the semiconductor substrate;

attaching the second conductive type impurity at least to a portion of the semiconductor substrate exposed in the openings to form an impurity layer on the portion;

performing low-temperature oxidation to remove a superficial layer of the impurity layer;

diffusing the impurity from the impurity layer to the semiconductor substrate to form a part of the embedded gate segments;

performing vapor-phase epitaxial growth using at least the first conductive type impurity and silicon to form a first epitaxial layer containing at least a part of the embedded gate segments and the active intrinsic layer on the semiconductor substrate; and forming a second epitaxial layer containing the cathode segment on the first epitaxial layer.

* * * * *